(12) United States Patent
Kurz et al.

(10) Patent No.: US 9,899,319 B2
(45) Date of Patent: Feb. 20, 2018

(54) RAISED E-FUSE

(71) Applicant: GLOBALFOUNDRIES Inc., Grand Cayman (KY)

(72) Inventors: Andreas Kurz, Dresden (DE); Andrei Sidelnicov, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/428,604

(22) Filed: Feb. 9, 2017

(65) Prior Publication Data

US 2017/0154846 A1 Jun. 1, 2017

Related U.S. Application Data

(62) Division of application No. 14/838,554, filed on Aug. 28, 2015, now Pat. No. 9,613,898.

(51) Int. Cl.
| H01L 23/525 | (2006.01) |
| H01L 29/08 | (2006.01) |
| H01L 29/06 | (2006.01) |
| H01L 27/12 | (2006.01) |
| H01L 29/78 | (2006.01) |

(52) U.S. Cl.
CPC ...... *H01L 23/5256* (2013.01); *H01L 27/1203* (2013.01); *H01L 29/0649* (2013.01); *H01L 29/0847* (2013.01); *H01L 29/7838* (2013.01)

(58) Field of Classification Search
None
See application file for complete search history.

(56) References Cited

U.S. PATENT DOCUMENTS

2012/0132990 A1  5/2012  Zhu et al.

*Primary Examiner* — Whitney T Moore
(74) *Attorney, Agent, or Firm* — Amerson Law Firm, PLLC

(57) ABSTRACT

A semiconductor device with a semiconductor-on-insulator (SOI) structure is provided including an insulating layer and a semiconductor layer formed on the insulating layer and a fuse. The fuse includes a first at least partially silicided raised semiconductor region with a first silicided portion and, adjacent to the first at least partially silicided raised semiconductor region, a second at least partially silicided raised semiconductor region with a second silicided portion. The second silicided portion is formed in direct physical contact with the first silicided portion.

18 Claims, 4 Drawing Sheets

RAISED E-FUSE

BACKGROUND OF THE INVENTION

1. Field of the Invention

Generally, the present disclosure relates to the field of manufacturing of integrated circuits and semiconductor devices, and, more particularly, to electrically programmable fuses, for example, in SOI configurations.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

In order to improve the product yield, a technique has been developed of "trimming" or electrically excluding circuit blocks which are no longer operable. This technique, particularly used during manufacturing of memory arrays, relies on redundant circuit blocks which can be incorporated into the main integrated circuit and activated once a defective circuit portion has been detected. On the other hand, the defective circuit block may be trimmed or electrically removed by blowing a fuse or a group of fuses which can electrically disconnect the defective block from the main circuit when in the open configuration. Reprogramming of an integrated circuit is thus rendered possible in a dynamic manner, even after the chip has been manufactured.

Electronic fuses (e-fuses; the terms "fuse" and "e-fuse" are used as interchangeable terms herein) may be used in complex integrated circuits as important mechanisms to allow adapting the performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, thereby re-adjusting overall circuit speed and the like.

Electronic fuses provided in the semiconductor devices represent electronic switches that may be activated once in order to provide a desired circuit adaptation. Hence, the electronic fuses may be considered as having a high impedance state, which typically represents a programmed state, and having a low impedance state, typically representing a non-programmed state of the electronic fuse. Since these electronic fuses may have a significant influence on the overall behavior of the entire integrated circuit, a reliable detection of the non-programmed and the programmed state has to be guaranteed, which is accomplished on the basis of appropriately designed logic circuitry. Furthermore, since typically these electronic fuses may be actuated only once over the lifetime of the semiconductor device under consideration, a corresponding programming activity has to ensure that a desired programmed state of the electronic fuse is reliably generated in order to provide well-defined conditions for the further operational lifetime of the device.

The programming of an e-fuse typically involves the application of a voltage pulse, which in turn induces a current pulse of sufficient current density in order to cause a permanent modification of a specific portion of the fuse. Thus, the electronic behavior of the fuse and the corresponding conductors for supplying the current and voltage to the fuse have to be precisely defined to obtain a reliable programmed state of the fuse. For this purpose, polysilicon is conventionally used for the fuse bodies, for instance in combination with a metal silicide, in which electromigration effects, in combination with other effects, caused by the current pulse, such as a significant heat generation, may then result in a permanent line degradation, thereby generating a high-Ohmic state of the fuse body.

The cross-section of a conventionally formed e-fuse 100 is shown in FIG. 1. The e-fuse 100 is formed on an isolation region 112 formed in a substrate (not shown). The substrate may be any appropriate carrier for a semiconductor integrated device. The isolation region 112 may, for example, have been formed by means of shallow trench isolation (STI). The e-fuse 100 includes a metal layer 124 formed above the surface of the isolation region 112. The material or material mixture constituting the layer 124 is typically the same as a material or material mixture used for a gate metal layer in devices fabricated using high-k/metal-gate (HKMG) technology. Although not shown in FIG. 1, a high-k dielectric layer may be interposed between the metal layer 124 and the surface of the isolation region 112.

A semiconductor layer 144 is then formed on the metal layer 124. The semiconductor layer 144 is preferably the same material used for forming the gate material layer on the gate metal layer. Thus, the semiconductor layer 144 is usually comprised of polysilicon. A metal silicide layer 164, typically nickel silicide, is finally formed on the surface of the semiconductor layer 144. The metal silicide layer 164 is conveniently formed during the same silicidation process used for forming electrical contacts to the electrodes (gate, source and drain) of a FET. The metal silicide layer 164 includes a first electrode 164a and a second electrode 164c arranged at opposite ends of the layer 164. The first electrode 164a and the second electrode 164c could, for example, be the anode and the cathode of the e-fuse 100. Contact terminals 174a and 174b are then formed so as to provide an electrical connection to the first electrode 164a and the second electrode 164c, respectively. The contact terminals 174a and 174b are typically comprised of a metal with a high electrical conductivity. When the e-fuse 100 is unprogrammed, the metal silicide layer 164 is continuous and provides an electrical connection between the first electrode 164a and the second electrode 164c, thus presenting a low electrical resistance between terminals 174a and 174b.

The e-fuse 100 may then be programmed by applying a predetermined electrical bias between terminals 174a and 174b, thereby inducing a current to flow across the e-fuse 100. Since the resistivity of the semiconductor layer 144 is much greater than that of the silicide layer 164, almost all current flows through the silicide layer 164. If the current intensity exceeds a predetermined threshold, electromigration occurs in the silicide layer 164, resulting in transport of the metal silicide material constituting the layer 164 towards the anode. After a sufficient amount of material has been transferred to one of the two electrodes 164a and 164c representing the anode, the e-fuse 100 switches to the programmed state when a gap (not shown) is formed in the metal silicide layer 164, thereby resulting in an open circuit between the two terminals 174a and 174b. The electrical resistance of the programmed e-fuse 100 thus rises by several orders of magnitude with respect to the resistance in the un-programmed state.

However, in the course of aggressive downscaling, for example, in the context of sub 28 nm or even sub 22 nm Very Large Scale Integrated (VLSI) Circuits CMOS technologies, the conventional manufacture of e-fuses as the one shown in FIG. 1 proves to be very complicated and bears the risk of severe failures, for example, caused by insufficient electrical isolation between the HKMG and the silicided layer. Moreover, conventionally formed e-fuses have a demand for relatively large areas and e-fuses realized in back end-of-line (BEoL) stacks typically suffer from the need for relatively high currents for blowing the fuses. Fuses located in silicon layers of non-SOI device portions of a semiconductor substrate show bad thermal isolation due to the relatively high thermal conductivity of silicon.

In view of the situation described above, the present disclosure provides a new kind of e-fuse and techniques for the formation of the same that overcome the above-mentioned problems and provide for reliable operation at relatively low programming currents and with good thermal isolation.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the formation of semiconductor devices including e-fuses. The semiconductor device may further include a plurality of field effect transistor (FET) devices, and formation of the e-fuses can be integrated within the process flow of the manufacturing of FETs.

A semiconductor device with a semiconductor-on-insulator (SOI) structure includes, among other things, an insulating layer and a semiconductor layer formed on the insulating layer and a fuse. The fuse includes a first at least partially silicided raised semiconductor region with a first silicided portion and, adjacent to the first at least partially silicided raised semiconductor region, a second at least partially silicided raised semiconductor region with a second silicided portion. The second silicided portion is formed in direct physical contact with the first silicided portion.

Another semiconductor device with a semiconductor-on-insulator (SOI) structure includes, among other things, an insulating layer and a semiconductor layer formed on the insulating layer and a fuse. The fuse includes a first at least partially silicided raised semiconductor region with a first silicided portion and, adjacent to the first at least partially silicided raised semiconductor region, a second at least partially silicided raised semiconductor region with a second silicided portion. The second raised semiconductor region partially overlaps the first raised semiconductor region.

BRIEF DESCRIPTION OF THE DRAWINGS

The disclosure may be understood by reference to the following description taken in conjunction with the accompanying drawings, in which like reference numerals identify like elements, and in which.

Figure 1:
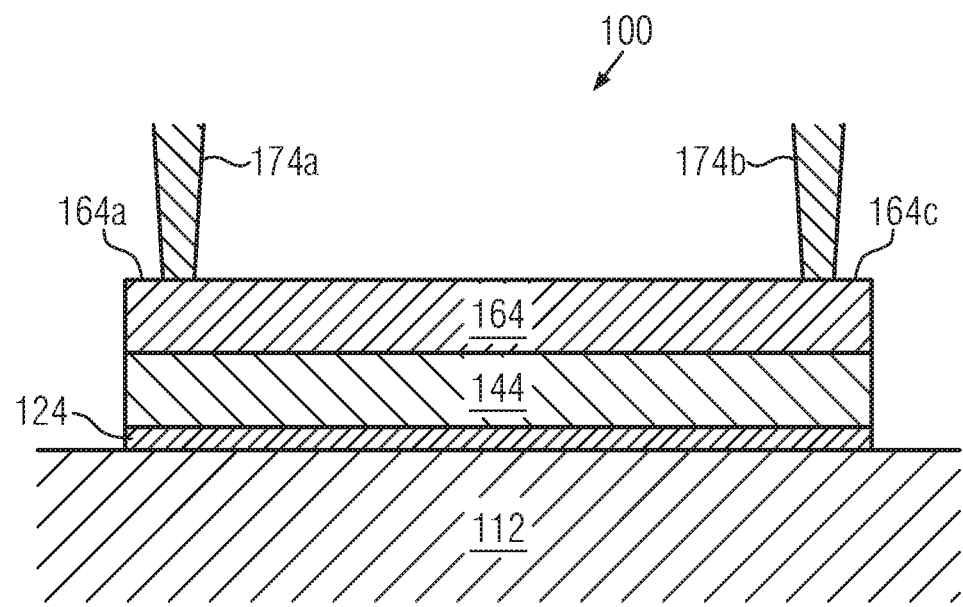
FIG. 1 shows an e-fuse according to an example of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, e.g., NMOS, PMOS, CMOS, etc. The techniques and technologies described herein may be utilized to fabricate MOS integrated circuit devices, including NMOS integrated circuit devices, PMOS integrated circuit devices, and CMOS integrated circuit devices.

It is expressly stated that, as used herein, the term "adjacent" when used without further specification covers (a) neighbored with a small gap (with a width smaller than the width, in particular, smaller than 20% of the width, of a smaller one of the first and second raised semiconductor regions) in-between, (b) directly adjacent without a gap, i.e., in direct mechanical contact with each other, and (c) overlapping with each other.

The present disclosure provides a method of manufacturing a semiconductor device comprising a raised e-fuse. An example of this method according to the present disclosure is illustrated in FIGS. 2a-2d.

Figure 2A:
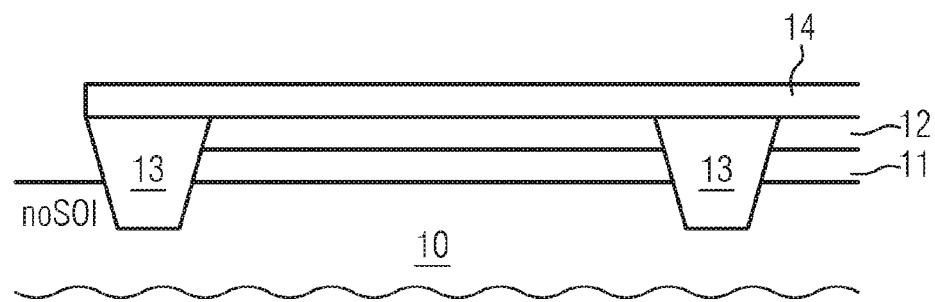
FIGS. 2a-2d illustrate a process flow of a method of manufacturing a semiconductor device comprising a raised e-fuse.

As shown in FIG. 2a, a silicon-on-insulator (SOI) structure, for example, a Fully Depleted SOI (FDSOI) structure, comprising a substrate 10, an insulating layer 11 and a semiconductor layer 12 is provided. The substrate 10 may be a semiconductor substrate. The semiconductor substrate may be a silicon substrate, in particular, a single crystal silicon substrate. Other materials may be used to form the semiconductor substrate such as, for example, germanium, silicon germanium, gallium phosphate, gallium arsenide, etc. An insulating layer 11 is formed on the substrate 10. The insulating layer 11 may be a buried oxide (BOX) layer, for example, including silicon dioxide, silicon nitride or any other suitable material. In particular, a thin or ultrathin BOX layer 11 with a thickness in the range of 10-30 nm may be formed on the substrate 10.

A semiconductor layer 12 is formed on the BOX layer 11. The semiconductor layer 12 may be comprised of any appropriate semiconductor material, such as silicon, silicon/germanium, silicon/carbon, other II-VI or III-V semiconductor components and the like. The semiconductor layer 12 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. In the following, it is assumed that the semiconductor layer 12 comprises silicon. It goes without saying that the disclosure herein is not limited to this kind of choice of material.

The semiconductor layer 12 formed on the BOX layer 11 may have a thickness in the range of 5-30 nm, for example, 10-20 nm.

The area designated for forming the e-fuse is defined by isolation regions 13, for example, provided in the form of shallow trench isolations (STI). The isolation regions 13 may separate the area designated for forming the e-fuse from an area designed for the formation of N-channel and P-channel transistor devices. In fact, the herein described method of forming an e-fuse can be integrated in the overall process flow of forming integrated circuits comprising FETs (see also description below with reference to FIGS. 6a and 6b). Moreover, one of the isolation regions 13 (the one on the left-hand side in FIG. 2a) may separate the SOI area designated for forming the e-fuse from a non-SOI area where no SOI devices are to be formed. A non-SOI region may be necessary for forming I/O or LDMOS devices as well as other non-FET devices, for example, diodes or bipolar junction transistors. For example, passive devices such as capacitors or resistors may be formed in the non-SOI area. The non-SOI area may be built by depositing and patterning a SiN mask and subsequently performing reactive ion etching. Depending on the actual design, the non-SOI area may or may not comprise a part of the neighbored isolation region 13.

According to the shown example, the manufacturing of the e-fuse may be integrated in the process flow of manufacturing Fully Depleted SOI (FDSOI) FETs, particularly on Ultrathin BOX (UTBOX) structures. The process of forming the e-fuse may start after formation of sidewall spacers of the FETs to be formed in another area. For example, the area designated for forming the e-fuse is always protected by a mask layer 14 during the process flow of manufacturing the FETs until the formation of the sidewall spacers of the FETs is completed. The mask layer 14 may be formed of or comprise an oxide material, for example, $SiO_2$. The mask layer 14 protects the semiconductor layer 12 during the various steps of forming and etching a plurality of layers involved in the formation of gate stacks of FETs as deposition of a high-k material (k value greater than 5), a metal material, a polysilicon material and patterning the gate stack and sidewall spacer layers.

Figure 2B:
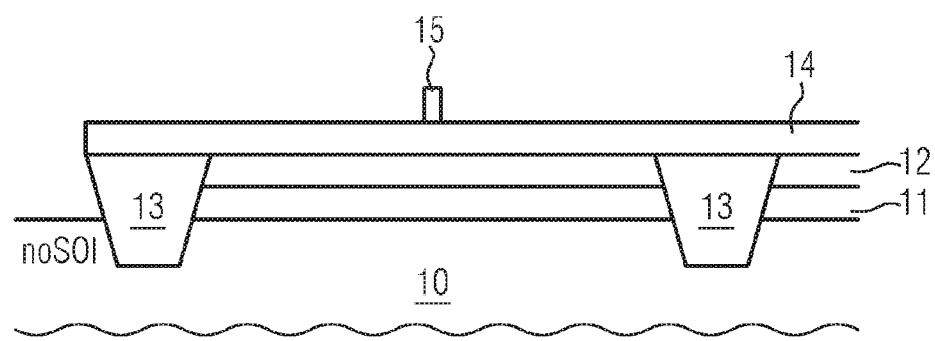
Figure 2C:
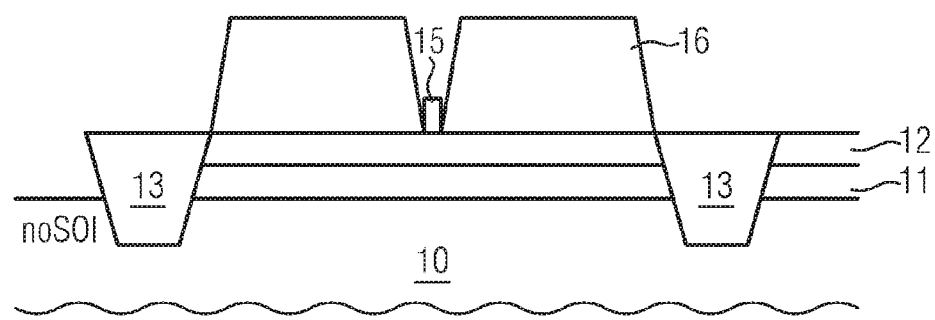

In the manufacturing stage shown in FIG. 2b, another mask layer 15 is formed on the mask layer 14. The other mask layer 15 may be formed of a nitride material, for example, SiN, and is provided to protect a central portion of the area designated for forming the e-fuse against the deposition of silicon or silicon-germanium material used to form raised source and drain regions for the FETs. The exposed portions of the mask layer 14 adjacent to the mask layer 15 are then removed, for example, by performing an HF pre-clean step, to allow for a proper formation of Si or SiGe regions in the area designated for forming the e-fuse adjacent to the patterned hard mask layer 15. As shown in FIG. 2c, a semiconductor material layer (e.g., Si or SiGe) layer 16 with a thickness in the range of 20-40 nm, for example, may be formed on the exposed semiconductor layer 12, for example, by epitaxial growth. Whereas in the following description reference is made to a Si or SiGe material, it is understood that any appropriate other semiconductor may be used instead.

Figure 2D:
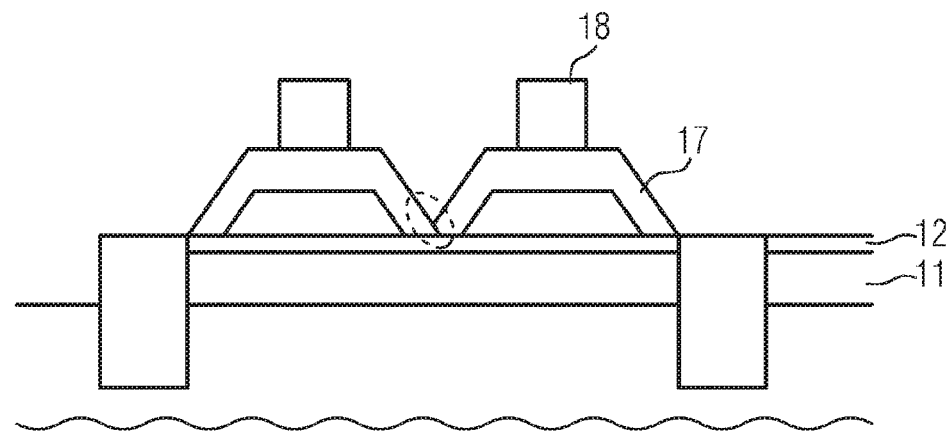

After formation of the silicon or silicon-germanium material 16, the hard mask 15 is removed as illustrated in FIG. 2d. The removal of the hard mask 15 may be achieved by a $H_3PO_4$ strip of reactive ion etching (RIE) that stops on the underlying (for example, $SiO_2$) mask layer 14.

In the manufacturing step shown in FIG. 2d, the mask layer 14 has been removed and the upper portions of the grown Si or SiGe material 16 are silicided to form a partially silicided Si or SiGe material comprising silicided portions 17. The silicided portions 17 may be thicker than the non-silicided ones. For example, the silicided portions 17 may have thicknesses of about 15 nm and the non-silicided portions of about 10 nm. Exposed portions of the semiconductor layer 12 may also be silicided in the same silicidation process. Silicidation may be achieved, for example, by depositing a metal-containing layer, for example, an NiPt, Ni or Co layer, on the surfaces of the grown Si or SiGe material 16 and performing one or more thermal anneal processes, as is known in the art. Contacts 18 are formed for contacting the silicided portions 17 of the silicided Si or SiGe material.

It has to be noted that, according to an alternative example, the two raised Si or SiGe regions 16 (a left region and a right region formed on the semiconductor layer 12) shown in FIGS. 2c and 2d may be formed in different process steps, for example, by making use of two (growing) masks, one for each of the regions 16, respectively.

Figure 3:
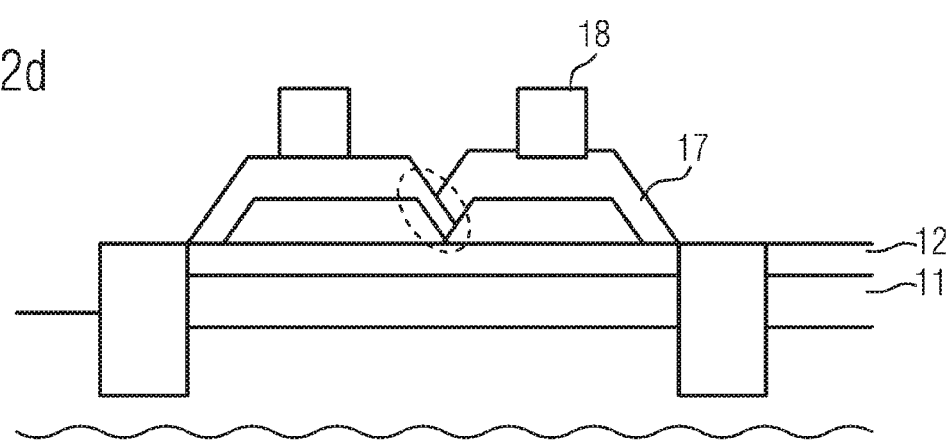
FIG. 3 illustrates an example of an e-fuse comprising two raised semiconductor regions in mechanical contact with each other and with overlapping silicided portions.
Figure 4:
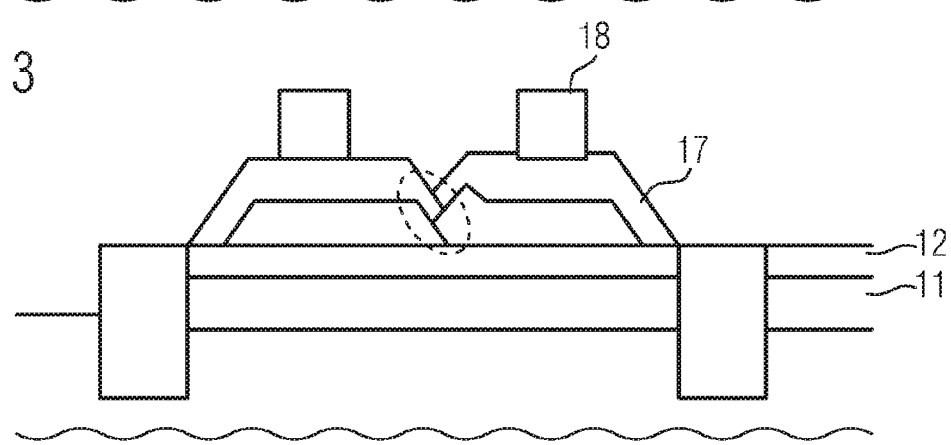
FIG. 4 illustrates an example of an e-fuse comprising two overlapping semiconductor regions with overlapping silicided portions.

Furthermore, in the above-described example, the Si or SiGe layer 16 has two separate regions, namely a left region and a right region, formed on the semiconductor layer 12, formed adjacent to each other and spaced to each other by some small gap with a width (from left to right in FIG. 2d) smaller than the width of each of the two regions. In particular, the gap may be smaller than 20% or 10% of the width of the smaller one of the two regions. The silicided portions 17, however, may overlap. According to further examples shown in FIGS. 3 and 4, the two regions of the Si or SiGe layer 16 may be formed directly adjacent to each other with no gap, i.e., the regions are in contact with each other, (FIG. 3) or they may be formed overlapping each other (FIG. 4). Moreover, the left region of the Si or SiGe layer 16 may by n$^+$ doped and the right one p$^+$ doped or vice versa.

In principle, the raised two regions of the Si or SiGe layer 16 may be formed successively one after the other with the help of two masks and two separate epitaxial growth processes. The process flow may be as follows. After gate patterning (final etch), a dielectric (e.g., 70 A SP0 SiN) will be deposited as a hard mask (HM) for the 1$^{st}$ raised epitaxial layer (e.g., in-situ doped n-EPI). A lithography step follows with HM etch defining the area for the n-epitaxial layer. The epitaxial material will be grown only over Si. This will be followed by HM deposition, a lithography step and HM etch for the second epitaxial growth (e.g., in-situ doped p-EPI). The remaining HM as well as Poly cap-nitride will be etched over Si. Several stages later, the non-protected Si or SiGe areas will be silicided.

In any case, by forming the regions of the Si or SiGe layer 16 very close to each other, in contact with each other or even overlapping each other, a "bottleneck" configuration is formed in the regions of overlapping silicided portions 17 of the regions obtained by the silicidation process. When an electric current flows through one of the contacts 18 to the silicided portions 17, the current density is relatively high (the current is concentrated) in the "bottleneck" regions indicated by the dashed circles in FIGS. 2d, 3 and 4. The current concentration results in good programming performance, particularly in terms of a reduced electric power (current strength) needed for the programming process. Moreover, the programming process is facilitated by forming the e-fuse over a BOX layer 11 that serves as a thermal isolation layer. The thermal isolation leads to an improved self-heating/melting of the e-fuse. This effect contributes to the reduced programming current needed as compared to conventional e-fuses formed in non-SOI areas where the semiconductor (for example, silicon) substrate represents a relatively efficient heat sink.

Figure 5:
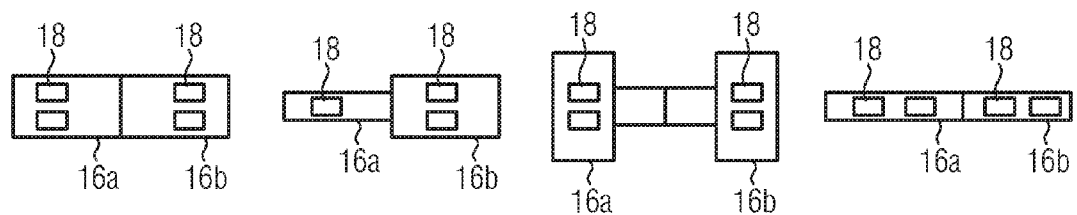
FIG. 5 shows examples of "footprints" (top views) of e-fuses according to the present disclosure.

As already mentioned, the above-described raised "bottleneck" e-fuse comprising the left and right silicided semiconductor material regions represents a space-saving configuration. FIG. 5 illustrates four examples of "footprints" (top views) of e-fuses taught herein. The two raised Si or SiGe regions 16a and 16b are formed in mechanical contact to each other and are electrically contacted for programming of the e-fuses by means of one or two contacts 18 provided for each of the regions 16a and 16b. Different shapes of the regions 16a and 16b that are considered suitable are shown in FIG. 5.

Figure 6A:
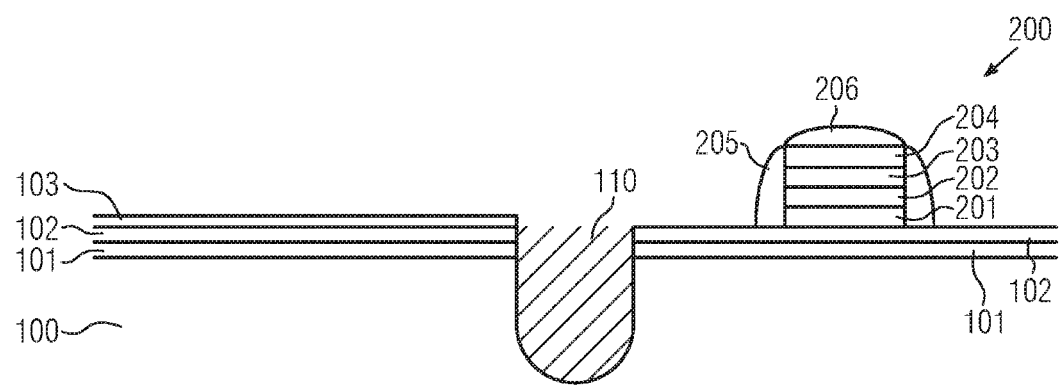
FIGS. 6a-6b illustrate a method of manufacturing a semiconductor device comprising a raised e-fuse and a FET in accordance with an example of the present disclosure.
Figure 6B:
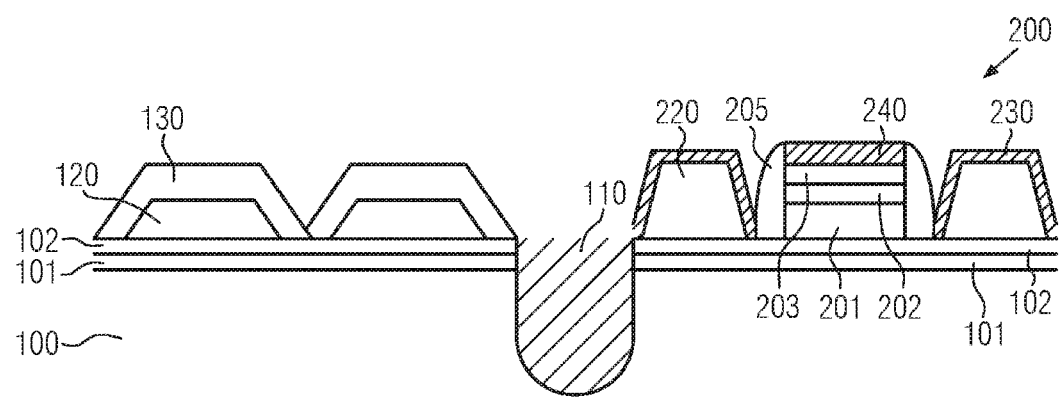

Formation of an e-fuse as herein disclosed can be integrated in the overall manufacturing of a semiconductor device comprising FETs. An example thereof is illustrated in FIGS. 6a and 6b. An FDSOI structure with a substrate 100, an ultrathin BOX layer 101, for example, with a thickness in the range of 10-30 nm, and an ultrathin semiconductor layer 102, for example, with a thickness in the range of 10-20 nm, is provided as shown in FIG. 6a. The substrate 100 may be a silicon substrate, in particular, a single crystal silicon substrate. Other materials may be used to form the substrate 100 such as, for example, germanium, silicon germanium, gallium phosphate, gallium arsenide, etc. The BOX layer 101 may, for example, include silicon dioxide, silicon nitride or any other suitable material.

The semiconductor layer 102 formed on the BOX layer 101 may be comprised of any appropriate semiconductor material, such as silicon, silicon/germanium, silicon/carbon, other II-VI or III-V semiconductor components and the like. The semiconductor layer 102 may comprise a significant amount of silicon or any other appropriate semiconductor materials may be used, for instance, a silicon-based material containing other iso-electronic components, such as germanium, carbon and the like. In the following, it is assumed that the semiconductor layer 102 comprises silicon without limiting the disclosure herein to this kind of choice of material.

An area designated for forming the e-fuse is defined by an isolation region 110, for example, a shallow trench isolation (STI), that is formed by appropriate lithography techniques as known in the art. Moreover, by the STI, an area designated for the formation of a FET is defined (on the right-hand-side of the STI 110 in FIGS. 6a and 6b).

In the manufacturing stage shown in FIG. 6a, a FET 200 is formed on the area designated for forming a FET. During the manufacturing steps for forming the FET 200 shown in FIG. 6a, the semiconductor layer 102 of the area designated for forming an e-fuse might be protected by an oxide mask layer 103, for example, by an SiO$_2$ layer 103.

The FET 200 of FIG. 6a, which may be an N-channel or P-channel FET with a suitably doped channel region formed in the semiconductor layer 102, may be formed as follows. A high-k dielectric layer 201, a work function adjusting layer 202, a metal gate layer 203 and a polysilicon layer 204 may subsequently be formed. Moreover, a cap layer 206 that may comprise a silicon oxide material and may have a thickness in a range from 10-100 nm, for example, in a range from 20-50 nm may be formed over the polysilicon layer 204. The stack of layers is etched to provide for the gate structure shown in FIG. 6a.

The high-k dielectric layer 201, for example, with a dielectric constant k>5, may comprise a transitional metal oxide, such as at least one of hafnium oxide, hafnium dioxide and hafnium silicon-oxynitride. According to some exemplary embodiments, the high-k dielectric layer 201 may be formed directly on the semiconductor layer 102. According to other embodiments, the high-k dielectric layer 201 may be formed on an insulating layer (not shown) comprising silicon oxide which is formed on the semiconductor layer 102. The work function adjusting layer 202 may comprise titanium nitride (TiN) or any other appropriate work function adjusting metal or metal oxide that is known in the art.

The metal gate layer 203 may comprise a plurality of layers that may include Al, AlN or TiN. In particular, the metal gate layer 203 may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like with a thickness of about 1-60 nm, i.e., the work function adjusting layer 202 may be integrated in the metal gate layer 203.

A sidewall spacer 205 adjacent to the gate electrode comprising the metal gate and poly gate may be formed. A liner layer (not shown) may be provided between the gate electrode and the sidewall spacer. The sidewall spacer 205 may include silicon dioxide, and the liner layer may include silicon nitride or vice versa. The sidewall spacer 205 may be provided in the form of a multilayer by subsequently epitaxially growing or depositing the respective layers of the gate structure and appropriately etching them.

It is noted that there are basically two well-known processing methods for forming a planar or 3D transistor with a high-k metal gate (HKMG) structure. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the "gate first" technique, on the other hand, involves forming a stack of layers of material across the substrate, wherein the stack of materials includes a high-k gate insulation layer, one or more metal layers, a layer of polysilicon, and a protective cap layer, for example, silicon nitride. One or more etching processes are performed to pattern the stack of materials to thereby define the basic gate structures for the transistor devices. Formation of an e-fuse in accordance with the present disclosure may be readily integrated in both the replacement gate process flow and gate first process flow.

An implantation step during which source and drain extension regions may be formed in the semiconductor layer 102 may follow the formation of the sidewall spacers 205. In this case, the sidewall spacers 205 represent an implantation mask for the implantation of source/drain extension regions. The source/drain extension regions are, therefore, aligned with regard to the sidewall spacers 205. The cap layer 206 protects the gate electrode structure of the FET 200 from being affected by the implantation. A halo implantation step may also be performed if considered appropriate. In FDSOI applications, however, no halo/extension implantation may be necessary.

After the formation of the sidewall spacers 205, the mask layer 103 is removed at least in regions where the e-fuse is to be formed. A semiconductor layer, for example, a semiconductor layer comprising silicon, for example, a silicon layer or a silicon-germanium layer is formed, for example, by (selective) epitaxy, in both the fuse area and the FET area on the exposed semiconductor layer 102. Thereby, raised source and drain regions 220 are formed adjacent to the sidewall spacers 205 in the FET area and raised semiconductor regions 120 are formed in the fuse area, as shown in FIG. 6b. The raised source and drain regions 220 and the raised semiconductor regions 120 may have thicknesses in the range of 20-50 nm, for example. In addition, the raised semiconductor regions 120 and 220 as well as the poly gate 204 are silicided. Silicidation may comprise deposition of an NiPt, Ni or Co layer on the surfaces of the raised semiconductor regions 120 and 220 and the poly gate 204 and performing one or more thermal anneal processes. The resulting silicided regions 130, 230 and 240 provide for low-resistance contacts. The resulting fuse is ready for burn-in by a programming current provided through electrical contacts (not shown in FIG. 6b). Similar to the examples shown in FIGS. 2d, 3 and 4, a "bottleneck" region for an increased current density during a programming process is provided in the raised e-fuse.

As a result e-fuses and techniques for forming the same are provided that allow for relatively low programming currents and reduced spatial requirements. The e-fuses may be formed by silicidation of an epitaxially grown semiconductor material providing raised regions on a semiconductor layer of an SOI substrate. In particular, such e-fuses can be advantageously realized in the 22 nm FDSOI technology.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising
a semiconductor-on-insulator (SOI) structure comprising an insulating layer and a semiconductor layer formed on said insulating layer; and
a fuse, said fuse comprising:
a first at least partially silicided raised semiconductor region with a first silicided portion; and
adjacent to said first at least partially silicided raised semiconductor region, a second at least partially silicided raised semiconductor region with a second silicided portion, wherein said second silicided portion is formed in direct physical contact with said first silicided portion.

2. The semiconductor device of claim 1, wherein said second raised semiconductor region is formed partially overlapping said first raised semiconductor region.

3. The semiconductor device of claim 1, wherein said second raised semiconductor region is formed in physical contact with said first raised semiconductor region.

4. The semiconductor device of claim 1, wherein said first silicided portion is formed overlapping said second silicided portion.

5. The semiconductor device of claim 1, wherein said first silicided portion is formed overlapping said second raised semiconductor region.

6. The semiconductor device of claim 1, wherein said semiconductor layer comprises silicon and said first and second raised semiconductor regions comprise epitaxial semiconductor material.

7. The semiconductor device of claim 6, wherein said epitaxial semiconductor material comprises silicon-germanium.

8. The semiconductor device of claim 6, wherein said epitaxial semiconductor material comprises silicon.

9. The semiconductor device of claim 1, further comprising a field effect transistor separated from said fuse by an isolation region, wherein said field effect transistor comprises a channel region made of a portion of said semiconductor layer and a raised source/drain region made of the same material as said first or second at least partially silicided raised semiconductor region.

10. The semiconductor device of claim 1, further comprising:
an additional insulating layer positioned over said silicided semiconductor layer and silicided raised semiconductor regions; and
contacts embedded in said additional insulating layer and contacting said silicided raised semiconductor regions.

11. A semiconductor device, comprising
a semiconductor-on-insulator (SOI) structure comprising an insulating layer and a semiconductor layer formed on said insulating layer; and
a fuse, said fuse comprising:
a first at least partially silicided raised semiconductor region with a first silicided portion; and
adjacent to said first at least partially silicided raised semiconductor region, a second at least partially silicided raised semiconductor region with a second silicided portion, wherein said second raised semiconductor region partially overlaps said first raised semiconductor region.

12. The semiconductor device of claim 11, wherein said first silicided portion is formed overlapping said second silicided portion.

13. The semiconductor device of claim 11, wherein said first silicided portion is formed overlapping said second raised semiconductor region.

14. The semiconductor device of claim 11, wherein said semiconductor layer comprises silicon and said first and second raised semiconductor regions comprise epitaxial semiconductor material.

15. The semiconductor device of claim 14, wherein said epitaxial semiconductor material comprises silicon-germanium.

16. The semiconductor device of claim 14, wherein said epitaxial semiconductor material comprises silicon.

17. The semiconductor device of claim 11, further comprising a field effect transistor separated from said fuse by an isolation region, wherein said field effect transistor comprises a channel region made of a portion of said semiconductor layer and a raised source/drain region made of the same material as said first or second at least partially silicided raised semiconductor region.

18. The semiconductor device of claim 11, further comprising:
an additional insulating layer positioned over said silicided semiconductor layer and silicided raised semiconductor regions; and
contacts embedded in said additional insulating layer and contacting said silicided raised semiconductor regions.

* * * * *